(12) United States Patent
Fukumoto et al.

(10) Patent No.: US 9,461,138 B2
(45) Date of Patent: Oct. 4, 2016

(54) NON-VOLATILE SEMICONDUCTOR MEMORY WITH NITRIDE SIDEWALL CONTACTING NITRIDE LAYER OF ONO GATE STACK AND METHODS FOR PRODUCING THE SAME

(71) Applicant: SEIKO EPSON CORPORATION, Tokyo (JP)

(72) Inventors: Yohei Fukumoto, Shiojiri (JP); Takaoki Sasaki, Sakata (JP)

(73) Assignee: SEIKO EPSON CORPORATION, Tokyo (JP)

( * ) Notice: Subject to any disclaimer, the term of this patent is extended or adjusted under 35 U.S.C. 154(b) by 0 days.

(21) Appl. No.: 14/377,278

(22) PCT Filed: Feb. 22, 2013

(86) PCT No.: PCT/JP2013/001031
§ 371 (c)(1),
(2) Date: Aug. 7, 2014

(87) PCT Pub. No.: WO2013/128864
PCT Pub. Date: Sep. 6, 2013

(65) Prior Publication Data
US 2015/0008500 A1    Jan. 8, 2015

(30) Foreign Application Priority Data
Feb. 28, 2012    (JP) .................................. 2012-041221

(51) Int. Cl.
*H01L 21/28* (2006.01)
*H01L 29/66* (2006.01)
(Continued)

(52) U.S. Cl.
CPC ......... *H01L 29/512* (2013.01); *H01L 21/0217* (2013.01); *H01L 21/02164* (2013.01); *H01L 21/28282* (2013.01); *H01L 29/513* (2013.01); *H01L 29/518* (2013.01);
(Continued)

(58) Field of Classification Search
None
See application file for complete search history.

(56) References Cited

U.S. PATENT DOCUMENTS 6,200,858 B1    3/2001    Kokubu
6,555,865 B2    4/2003    Lee et al.
(Continued)

FOREIGN PATENT DOCUMENTS

JP    A-07-226502    8/1995
JP    A-2000-058680    2/2000
(Continued)

OTHER PUBLICATIONS

International Search Report issued in International Application No. PCT/JP2013/001031 dated Apr. 2, 2013.

*Primary Examiner* — Marc Armand
*Assistant Examiner* — Younes Boulghassoul
(74) *Attorney, Agent, or Firm* — Oliff PLC

(57) ABSTRACT

A non-volatile semiconductor memory free from adverse effects due to process charge is provided. The non-volatile semiconductor memory includes: a silicon substrate; a first silicon oxide film; a second silicon oxide film; a first silicon nitride film; and a second silicon nitride film, wherein the first silicon oxide film is layered on the silicon substrate, the first silicon nitride film is layered on the first silicon oxide film, the second silicon oxide film is layered on the first silicon nitride film, and the second silicon nitride film is layered to have a first part that is in contact with the first silicon nitride film and a second part that is in contact with the silicon substrate.

7 Claims, 9 Drawing Sheets

(51) Int. Cl.
    *H01L 29/51*     (2006.01)
    *H01L 29/788*    (2006.01)
    *H01L 29/792*    (2006.01)
    *H01L 21/02*     (2006.01)

(52) U.S. Cl.
    CPC .. *H01L 29/66825* (2013.01); *H01L 29/66833* (2013.01); *H01L 29/788* (2013.01); *H01L 29/7881* (2013.01); *H01L 29/792* (2013.01)

(56) References Cited

U.S. PATENT DOCUMENTS

| | | | |
|---|---|---|---|
| 6,573,132 | B1 | 6/2003 | Uehara et al. |
| 6,713,826 | B2 | 3/2004 | Uehara et al. |
| 7,488,634 | B2 * | 2/2009 | Shin .................. H01L 21/28185 257/411 |
| 8,629,025 | B2 * | 1/2014 | Chen ..................... H01L 29/792 257/324 |
| 2001/0021133 | A1 * | 9/2001 | Iijima ........................... 365/201 |
| 2004/0094793 | A1 | 5/2004 | Noguchi et al. |
| 2004/0157451 | A1 | 8/2004 | Koh |
| 2006/0019436 | A1 | 1/2006 | Lee |
| 2006/0205148 | A1 * | 9/2006 | Deppe et al. ................. 438/257 |
| 2006/0267080 | A1 * | 11/2006 | Hayakawa et al. ........... 257/324 |

FOREIGN PATENT DOCUMENTS

| | | | | |
|---|---|---|---|---|
| JP | A-2000-340792 | | 12/2000 | |
| JP | A-2001-326288 | | 11/2001 | |
| JP | A-2002-141500 | | 5/2002 | |
| JP | A-2002-222876 | | 8/2002 | |
| JP | A-2002-334942 | | 11/2002 | |
| JP | A-2003-068898 | | 3/2003 | |
| JP | 2003264247 | * | 9/2003 | ......... H01L 21/8247 |
| JP | A-2003-264247 | | 9/2003 | |
| JP | A-2004-165553 | | 6/2004 | |
| JP | A-2006-032541 | | 2/2006 | |
| JP | A-2006-269697 | * | 10/2006 | ......... H01L 21/8247 |
| JP | A-2007-005699 | * | 1/2007 | ......... H01L 21/8247 |
| JP | A-2008-218727 | | 9/2008 | |
| JP | A-2009-071325 | | 4/2009 | |
| TW | 200605363 | | 6/2006 | |
| WO | WO 2006/080081 A1 | | 8/2006 | |

* cited by examiner

1

NON-VOLATILE SEMICONDUCTOR MEMORY WITH NITRIDE SIDEWALL CONTACTING NITRIDE LAYER OF ONO GATE STACK AND METHODS FOR PRODUCING THE SAME

TECHNICAL FIELD

The present invention relates to a non-volatile semiconductor memory having a layer structure of silicon oxide film-silicon nitride film-silicon oxide film, and to a method for producing the non-volatile semiconductor memory.

BACKGROUND ART

Heretofore, there is a semiconductor memory called EEPROM, which is capable of repeating reading and writing. EEPROM is a non-volatile semiconductor memory in which stored data do not disappear when power is turned off. In particular, one capable of partially or entirely rewriting data at a time is called flash memory.

There are types of flash memory, which are called NAND type and NOR type. In either case, a memory cell itself has a similar structure. There are types of the structure of the memory cell, called floating gate type and charge trap type. Both the floating gate type and the charge trap type have a transistor structure of the MIS (metal-insulator-semiconductor) type. The floating gate type has a floating gate electrode provided in a gate insulating film and stores data by retaining charges in the floating gate electrode. In contrast, the charge trap type includes a gate insulating film having a layer structure of silicon oxide film-silicon nitride film-silicon oxide film (ONO structure), in which data is stored by accumulating charges in a discrete trap that is present in the vicinity of the interface between the silicon nitride film and the silicon oxide film on the silicon substrate side and thereby varying the threshold of the transistor. There are types of the charge trap type, called SONGS (Silicon Oxide Nitride Oxide Semiconductor) type and MONOS (Metal Oxide Nitride Oxide Semiconductor) type. It should be noted that, in either the floating gate type or the charge trap type, the oxide film on the silicon substrate side is called tunnel oxide film.

Although the floating gate type was previously mainstream, the charge trap type tends to be increasingly used in recent years. One of the reasons for that is that the charge trap type has an advantage that some reduction in insulating properties of part of the tunnel oxide film does not matter much because charges are captured in the discrete trap of the silicon nitride film that is an insulation film, whereas the floating gate type requires the tunnel oxide film to have high insulating properties because charges are captured in the floating gate layer. Further, since the thickness of the tunnel oxide film itself can be reduced more in the charge trap type, a voltage for writing data can be reduced in the charge trap type as well, which is also a great advantage.

For the aforementioned reasons, etc., the charge trap type tends to be favored. However, there is a demand for further improving the data retention characteristics and the endurance to repeated writing and erasing. To deal with such a demand, Patent Literature 1 discloses that a SiOxNy thin film, formed by atomic layer chemical vapor deposition, having an intermediate composition between $SiO_2$ and $Si_3N_4$ is provided as a trap formation layer. It is disclosed that such a configuration of the trap layer allows well-controlled formation of traps with high density to a desired depth, so that the data retention characteristics and the endurance to repeated writing and erasing can be improved, and a large difference in threshold voltage as a memory effect can be ensured, which is advantageous in multi-leveling.

CITATION LIST

Patent Literature

Patent Literature 1: JP-A-2002-222876

SUMMARY OF INVENTION

Technical Problem

However, even if a trap layer capable of ensuring a large difference in threshold voltage is provided, there is a problem that, when charges are captured in the trap layer in a production process, and the production process ends in the state where the charges are captured, the threshold voltage is varied as compared to that in the state where no charges are captured.

Solution to Problem

The present invention has been accomplished in order to overcome at least one of the aforementioned problem and challenge, and can be realized as the following application examples or embodiments.

APPLICATION EXAMPLE 1

A non-volatile semiconductor memory according to this application example includes: a silicon substrate; a first silicon oxide film; a second silicon oxide film; a first silicon nitride film; and a second silicon nitride film, wherein the first silicon oxide film is layered on the silicon substrate, the first silicon nitride film is layered on the first silicon oxide film, the second silicon oxide film is layered on the first silicon nitride film, and the second silicon nitride film is layered to have a first part that is in contact with the first silicon nitride film and a second part that is in contact with the silicon substrate.

According to this configuration, the charge retaining portion of the non-volatile semiconductor memory is composed of the first silicon oxide film, the first silicon nitride film, and the second silicon oxide film that are layered on the silicon substrate (ONO structure), and the second silicon nitride film is in contact with the first silicon nitride film and the silicon substrate, thereby allowing excess charges captured in the ONO structure in a predetermined step in production to diffuse into the silicon substrate via the second silicon nitride film in another predetermined step. Thus, it is possible to reduce the influence of the excess charges on the threshold voltage. This can enhance high-speed and low-voltage memory operation.

In the production process, charges are captured in the first silicon nitride film of the ONO structure, and the production may possibly end while the charges are captured therein. In this case, there is a possibility that the amount of charges that remain captured in the first silicon nitride film affects operation as a non-volatile semiconductor memory. The larger the amount of charges that remain captured in the first silicon nitride film, the higher the threshold voltage in writing operation as a memory. When the threshold voltage becomes higher, it is probable that the amount of charges that are newly captured in the first silicon nitride film becomes less when performing writing operation as a non-volatile semiconductor memory. This affects the amount of current flowing during reading operation as a memory, resulting in a need for more time to cause a predetermined change in data output of the memory. Therefore, a non-volatile semiconductor memory whose production process has ended with a larger number of charges remaining captured in the first silicon nitride film is unfit for high-speed and low-voltage operation. Further, since the threshold voltage of the memory varies from a design value, there is a limitation in changing or adjusting the impurity concentration of the channel portion, which is accompanied by variation of the threshold voltage.

As in this application example, when the second silicon nitride film has a first part in contact with the first silicon nitride film, and the second silicon nitride film has a second part in contact with the silicon substrate, it is possible to allow charges captured in the first silicon nitride film in a predetermined step to diffuse into the silicon substrate via the second silicon nitride film in another predetermined step after the aforementioned predetermined step. This can enhance a reduction of the amount of charges that remain captured in the first silicon nitride film, so as to allow high-speed and low-voltage operation of the non-volatile semiconductor memory to be achieved.

APPLICATION EXAMPLE 2

A non-volatile semiconductor memory according to this application example includes: a silicon substrate; a first silicon oxide film; a second silicon oxide film; a third silicon oxide film; a first silicon nitride film; and a second silicon nitride film, wherein the first silicon oxide film is layered on the silicon substrate, the first silicon nitride film is layered on the first silicon oxide film, the second silicon oxide film is layered on the first silicon nitride film, and the third silicon oxide film has a thickness that is smaller than that of the first silicon oxide film, and the second silicon nitride film has a first part that is in contact with the first silicon nitride film and a second part that is in contact with the silicon substrate via the third silicon oxide film.

According to this configuration, the charge retaining portion of the non-volatile semiconductor memory is composed of the first silicon oxide film, the first silicon nitride film, and the second silicon oxide film that are layered on the silicon substrate (ONO structure), and the second silicon nitride film is in contact with the first silicon nitride film and with the silicon substrate via the third silicon oxide film, thereby allowing excess charges captured in the ONO structure in a predetermined step in production to diffuse via the second silicon nitride film and the third silicon oxide film in another predetermined step. Thus, it is possible to reduce the influence of the excess charges on the threshold voltage. This can enhance high-speed and low-voltage memory operation.

As described above, an effect to achieve high-speed and low-voltage operation of the non-volatile semiconductor memory is given by reducing the charges that are captured in the first silicon nitride film in the production process more. Since the third silicon oxide film has a thickness that is smaller than the thickness of the first silicon oxide film, it is easier to allow the charges captured in the first silicon nitride film to diffuse via the second silicon nitride film and the third silicon oxide film than via the first silicon oxide film.

APPLICATION EXAMPLE 3

It is preferable that the non-volatile semiconductor memory according to the aforementioned application examples further includes a silicide region in the silicon substrate, wherein the silicide region is in contact with the second part of the second silicon nitride film.

According to this configuration, the second silicon nitride film is in contact with the silicide region, thereby allowing charges from the second silicon nitride film to diffuse into the silicon substrate more efficiently. The silicide region may be in contact with the second silicon nitride film via the third silicon oxide film.

APPLICATION EXAMPLE 4

It is preferable that the non-volatile semiconductor memory according to the aforementioned application examples further includes a first electrode on the second silicon oxide film, wherein the second silicon nitride film has a third part that is in contact with the first electrode.

According to this configuration, the second silicon nitride film is in contact with the first electrode, thereby allowing charges captured in the first silicon nitride film in the production process to diffuse into the first electrode via the second silicon nitride film. This allows the charges to diffuse into the first electrode as well as into the silicon substrate, so that the charges captured in the first silicon nitride film can diffuse more efficiently.

APPLICATION EXAMPLE 5

In the non-volatile semiconductor memory according to the aforementioned application examples, it is preferable that the third silicon oxide film has a thickness of not more than 22 Å.

According to this configuration, the third silicon oxide film has a thickness of not more than 22 Å, thereby allowing charges from the second silicon nitride film to diffuse into the silicon substrate more efficiently.

APPLICATION EXAMPLE 6

In the non-volatile semiconductor memory according to the aforementioned application examples, it is preferable that the second silicon nitride film has a thickness of at least 45 Å.

According to this configuration, the second silicon nitride film has a thickness of at least 45 Å, thereby enabling charges in the first silicon nitride film to be transferred more efficiently to the second silicon nitride film.

APPLICATION EXAMPLE 7

A method for producing a non-volatile semiconductor memory according to this application example includes: a first step of forming a first silicon oxide film on a silicon substrate; a second step of forming a first silicon nitride film on the first silicon oxide film; a third step of forming a second silicon oxide film on the first silicon nitride film; a fourth step of patterning the first silicon oxide film, the first silicon nitride film, and the second silicon oxide film into predetermined shapes; and a fifth step of forming a second silicon nitride film after the fourth step, wherein in the fourth step, the first silicon nitride film and the silicon substrate are exposed, and in the fifth step, the first silicon nitride film and the second silicon nitride film are in contact with each other.

According to this method, the first silicon nitride film and the silicon substrate are exposed by patterning in the fourth step, and the second silicon nitride film is formed in the fifth step after the fourth step, thereby allowing the second silicon nitride film to be in contact with the first silicon nitride film and with the silicon substrate. This allows charges captured in the first silicon nitride film to diffuse into the silicon substrate via the second silicon nitride film in a step after the fifth step.

APPLICATION EXAMPLE 8

The method for producing a non-volatile semiconductor memory according to the aforementioned application example may further include a sixth step, between the fourth step and the fifth step, of forming a third silicon oxide film in a region where the silicon substrate is exposed.

According to this method, the second silicon nitride film is formed in the fifth step, thereby allowing the second silicon nitride film to be in contact with the first silicon nitride film and with the silicon substrate via the third silicon oxide film. The third silicon oxide film may be formed by heating in an oxygen atmosphere, or a silicon oxide film that is naturally formed by oxidation of the silicon substrate, for example, due to exposure to the atmosphere may serve as the third silicon oxide film.

APPLICATION EXAMPLE 9

A method for producing a non-volatile semiconductor memory according to this application example includes: a first step of forming a first silicon oxide film on a silicon substrate; a second step of forming a first silicon nitride film on the first silicon oxide film; a third step of forming a second silicon oxide film on the first silicon nitride film; a fourth step of patterning the first silicon oxide film, the first silicon nitride film, and the second silicon oxide film into predetermined shapes; and a fifth step of forming a second silicon nitride film after the fourth step, wherein in the fourth step, the first silicon nitride film is exposed, and the first silicon oxide film is etched, so that a third silicon oxide film having a thickness that is smaller than that of the first silicon oxide film is formed, and in the fifth step, the first silicon nitride film and the second silicon nitride film are in contact with each other.

According to this method, the second silicon nitride film is formed in the fifth step, thereby allowing the second silicon nitride film to be in contact with the first silicon nitride film and with the silicon substrate via the third silicon oxide film.

DESCRIPTION OF EMBODIMENTS

Hereinafter, embodiments of the present invention are described with reference to the drawings. It should be noted that the drawings used in the following description are schematic views mainly depicting portions necessary for the convenience of the description. Therefore, deformations are applied thereto, and parts depicted as different shapes or different size ratios are included therein.

First Embodiment

Figure 1:
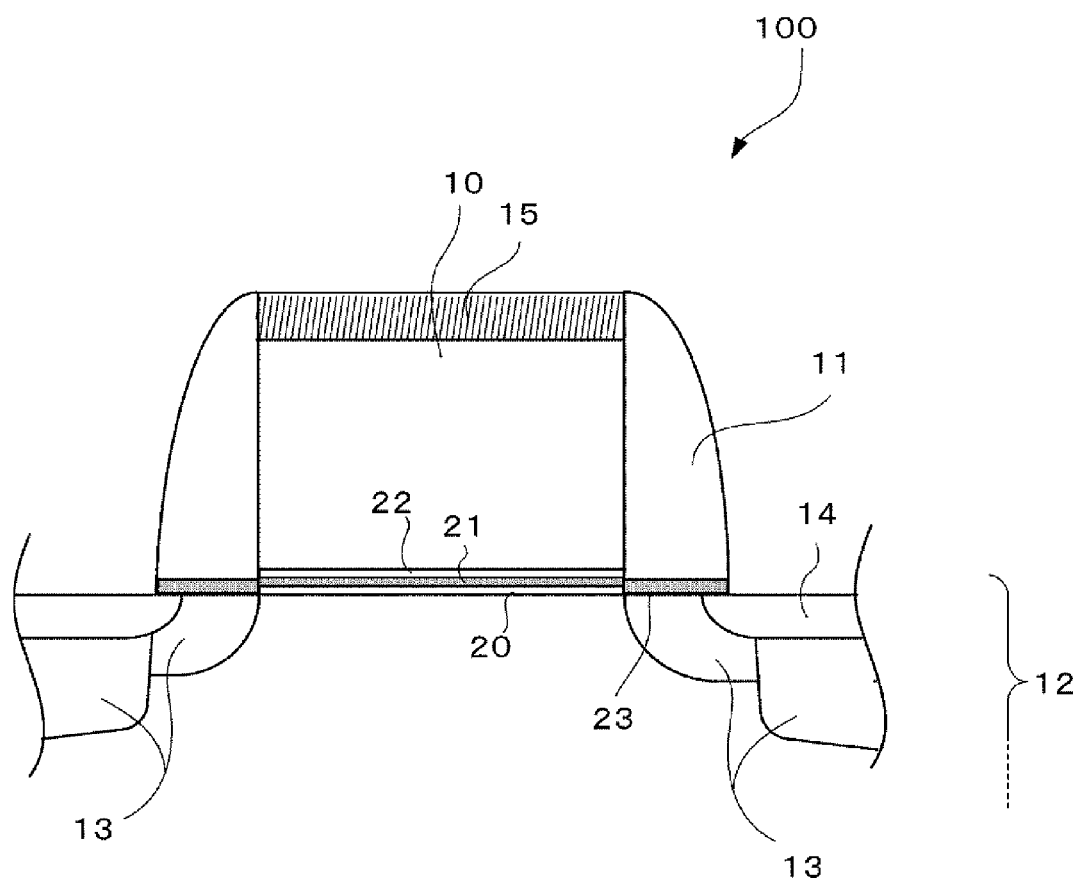
FIG. 1 is a schematic sectional view of a non-volatile semiconductor memory in a first embodiment.

FIG. 1 shows a sectional view of a non-volatile semiconductor memory 100 to which the present invention is applied. The non-volatile semiconductor memory 100 is formed using a silicon substrate 12, and has a first electrode 10, a side wall 11, a source region/drain region 13, a silicide region 14, a silicide layer 15, a first silicon oxide film 20, a first silicon nitride film 21, a second silicon oxide film 22, and a second silicon nitride film 23. A polysilicon film, for example, is used as the first electrode 10. A silicon oxide film, for example, is used as the side wall 11. The source region/drain region 13 and the silicide region 14 are regions formed in the silicon substrate 12. Examples of silicide used herein include cobalt silicide and titanium silicide. Further, a trap layer for a memory function has an ONO structure composed of the first silicon oxide film 20, the first silicon nitride film 21, and the second silicon oxide film 22. The second silicon nitride film 23 is in contact with the first silicon nitride film 21 and the silicon substrate 12. Hereinafter, the silicon substrate 12 is described to include the source region/drain region 13 and the silicide region 14, unless otherwise specified.

Figure 9:
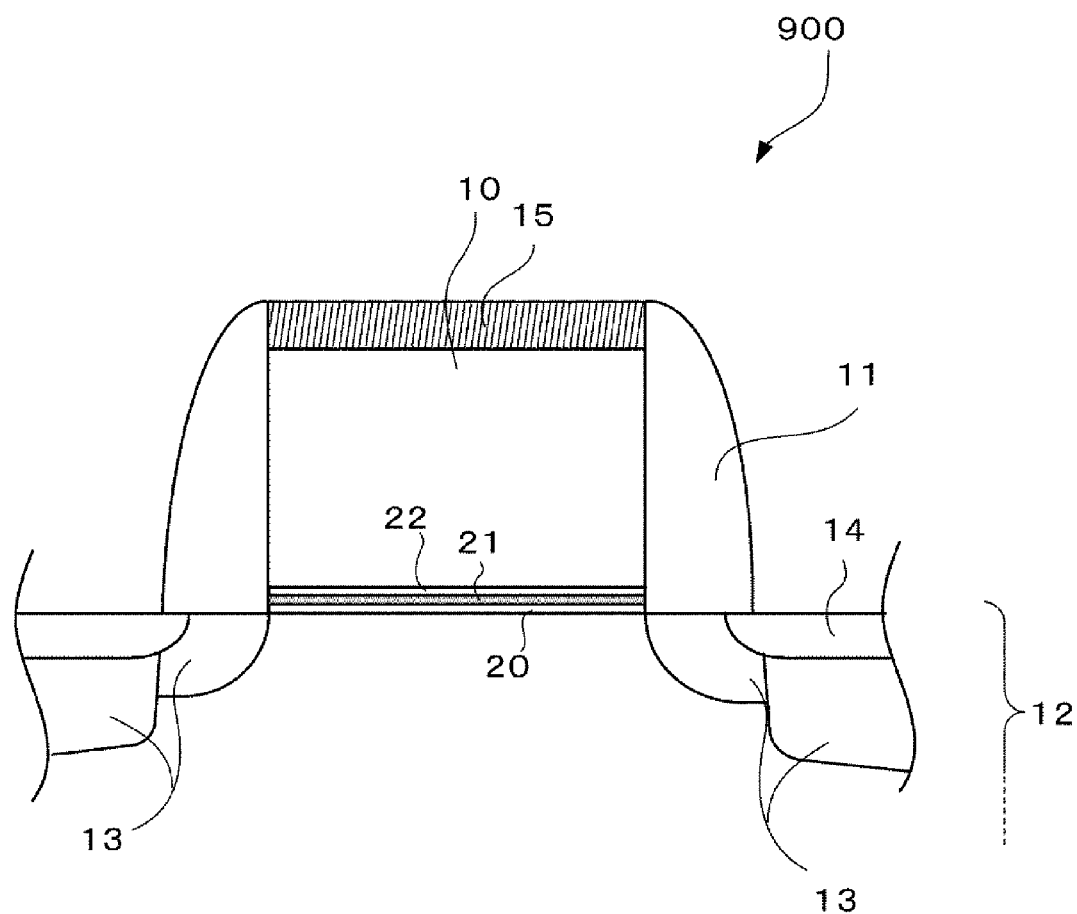
FIG. 9 is a schematic sectional view of a conventional non-volatile semiconductor memory.

For comparison, FIG. 9 shows a sectional view of a conventional non-volatile semiconductor memory 900. The non-volatile semiconductor memory 900 is different from the non-volatile semiconductor memory 100 to which the present invention is applied, in that the second silicon nitride film 23 is not provided. In the non-volatile semiconductor memory 900, a silicon oxide film is generally used as the side wall 11. In this case, the side surface of the first silicon nitride film is covered by the silicon oxide film.

In the production processes of the non-volatile semiconductor memories 100 and 900, a treatment using plasma such as etching and sputtering is often used, in which charges derived from plasma are injected into the ONO structure (trap layer) composed of the first silicon oxide film 20, the first silicon nitride film 21, and the second silicon oxide film 22, and the charges are retained therein. Such a phenomenon is called process charge in the present application. When process charge occurs, it is difficult for the conventional non-volatile semiconductor memory 900 to allow the diffusion of charges generated by the process charge, because the silicon oxide film has high insulating properties. Therefore, the production process ends in the state where a large number of charges remain captured in the trap layer, which may result in a non-volatile semiconductor memory that is unfit for high-speed and low-voltage operation in some cases. Further, since the threshold voltage of the memory varies from a design value, there is a limitation in changing or adjusting the impurity concentration of the channel portion, which is accompanied by variation of the threshold voltage.

In the non-volatile semiconductor memory 100 to which the present invention is applied (FIG. 1), the second silicon nitride film 23 is added to the conventional non-volatile semiconductor memory 900. The second silicon nitride film 23 is in contact with the silicon substrate 12 and the side surface of the first silicon nitride film 21. Silicon nitride films have insulating properties that are lower than those of silicon oxide films. Therefore, it is possible to allow charges which are generated by the process charge and retained in the trap layer to diffuse into the silicon substrate 12 via the second silicon nitride film 23. The diffusion of charges is accelerated by heat treatment. For the heat treatment, a dedicated step may be provided, or heat treatment that is conventionally used in a production process of a memory, such as silicidation and activation of impurities, may be used. The second silicon nitride film 23 needs only to be an insulation film having insulating properties that are lower than those of silicon oxide films. The second silicon nitride film 23, for example, may be a silicon oxynitride film.

Figure 5:
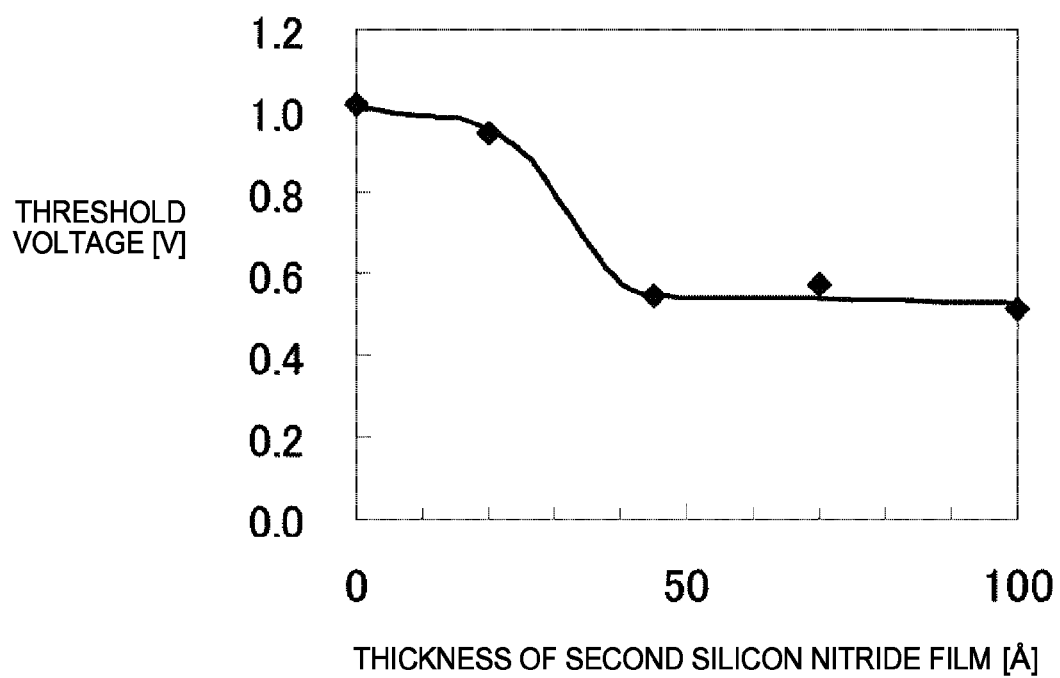
FIG. 5 is a graph showing characteristics of a second silicon nitride film.

FIG. 5 shows a graph illustrating a relationship between the thickness of the second silicon nitride film and the threshold voltage of the non-volatile semiconductor memories 100 and 900. In this graph, the process charge causes electrons to accumulate in the trap layer, and the threshold voltage increases. When the second silicon nitride film is 0 Å, that is, in the case of the non-volatile semiconductor memory 900, the threshold voltage is 1.0 V. On the other hand, in the case of the non-volatile semiconductor memory 100 in which the second silicon nitride film has a thickness of more than 0 Å, the larger the thickness of the second silicon nitride film, the more the electrons accumulated in the trap layer diffuse, and the more the threshold voltage decreases. When the second silicon nitride film has a thickness of at least 45 Å, the threshold voltage decreases and becomes stable at about 0.6 V, which therefore is particularly preferred. This dependency of the threshold voltage on the film thickness is the same in the second to fourth embodiments, which will be described below.

Second Embodiment

Hereinafter, in the subsequent embodiments including this embodiment, the same numerals are given to the same components as in the first embodiment, and the descriptions thereof are omitted.

Figure 2:
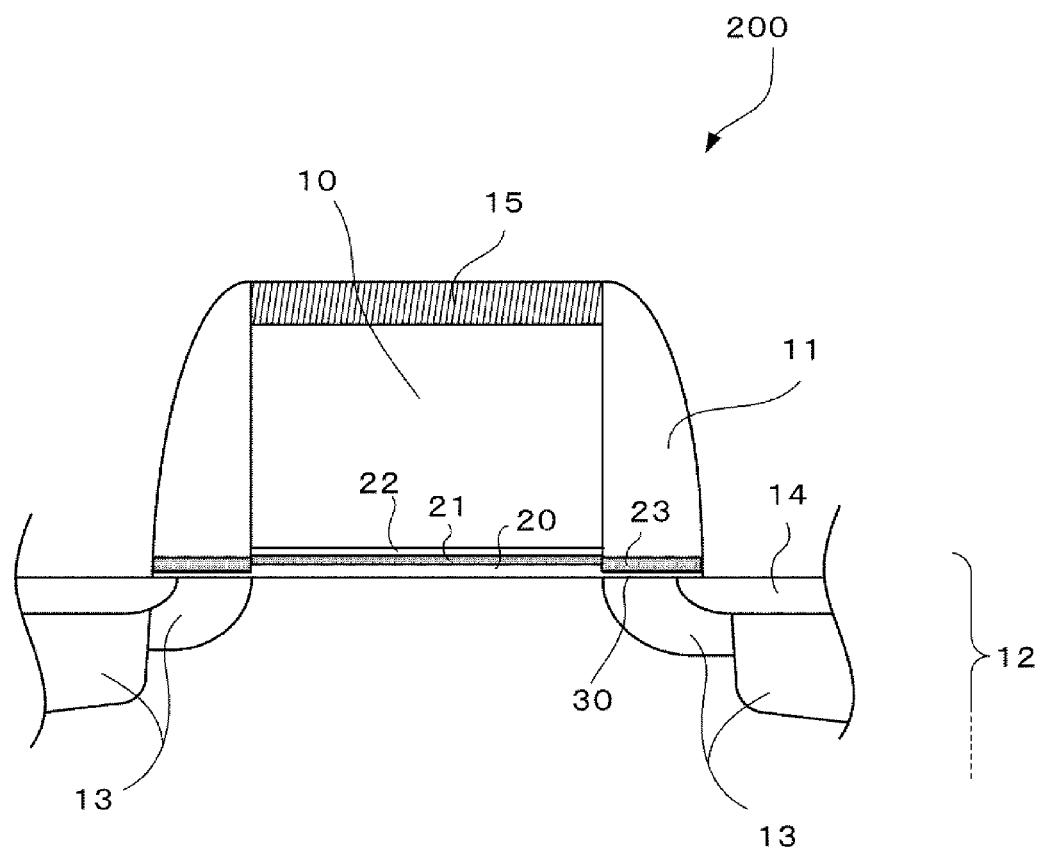
FIG. 2 is a schematic sectional view of a non-volatile semiconductor memory in a second embodiment.

FIG. 2 shows a sectional view of a non-volatile semiconductor memory 200 to which the present invention is applied. The non-volatile semiconductor memory 200 is formed by adding a third silicon oxide film 30 to the components of the non-volatile semiconductor memory 100. The second silicon nitride film 23 is in contact with the silicon substrate 12 via the third silicon oxide film 30. The third silicon oxide film 30 is formed to have a thickness that is smaller than the thickness of the first silicon oxide film 20. This allows charges in the first silicon nitride film 21 to diffuse via the third silicon oxide film 30, even when the first silicon oxide film 20 serves as a barrier to the diffusion of the charges.

Figure 6:
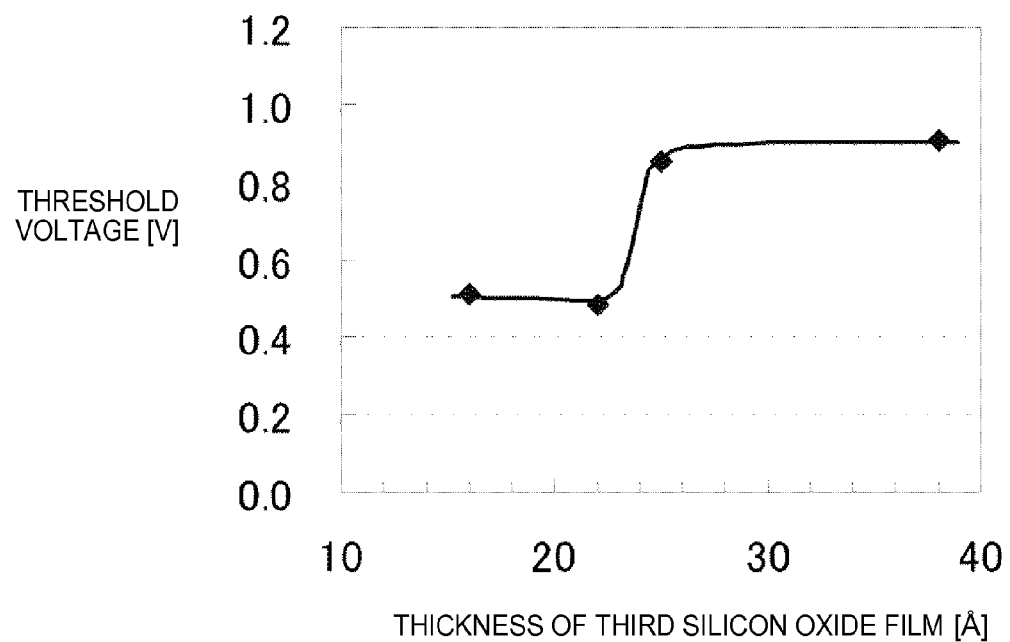
FIG. 6 is a graph showing characteristics of a third silicon oxide film.

FIG. 6 shows a graph illustrating a relationship between the thickness of the third silicon oxide film and the threshold voltage of the non-volatile semiconductor memory 200. In this graph, the process charge causes electrons to accumulate in the trap layer, and the threshold voltage increases. In the non-volatile semiconductor memory 200, the smaller the thickness of the third silicon oxide film, the more the electrons accumulated in the trap layer diffuse, and the more the threshold voltage decreases. When the third silicon oxide film has a thickness of not more than 22 Å, the threshold voltage decreases and becomes stable at about 0.5 V, which therefore is particularly preferred. This dependency of the threshold voltage on the film thickness is the same in the fourth embodiment, which will be described below.

It should be noted that the third silicon oxide film 30 may be intentionally formed, or may be naturally formed in a step before the second silicon nitride film 23 is formed.

Third Embodiment

Figure 3:
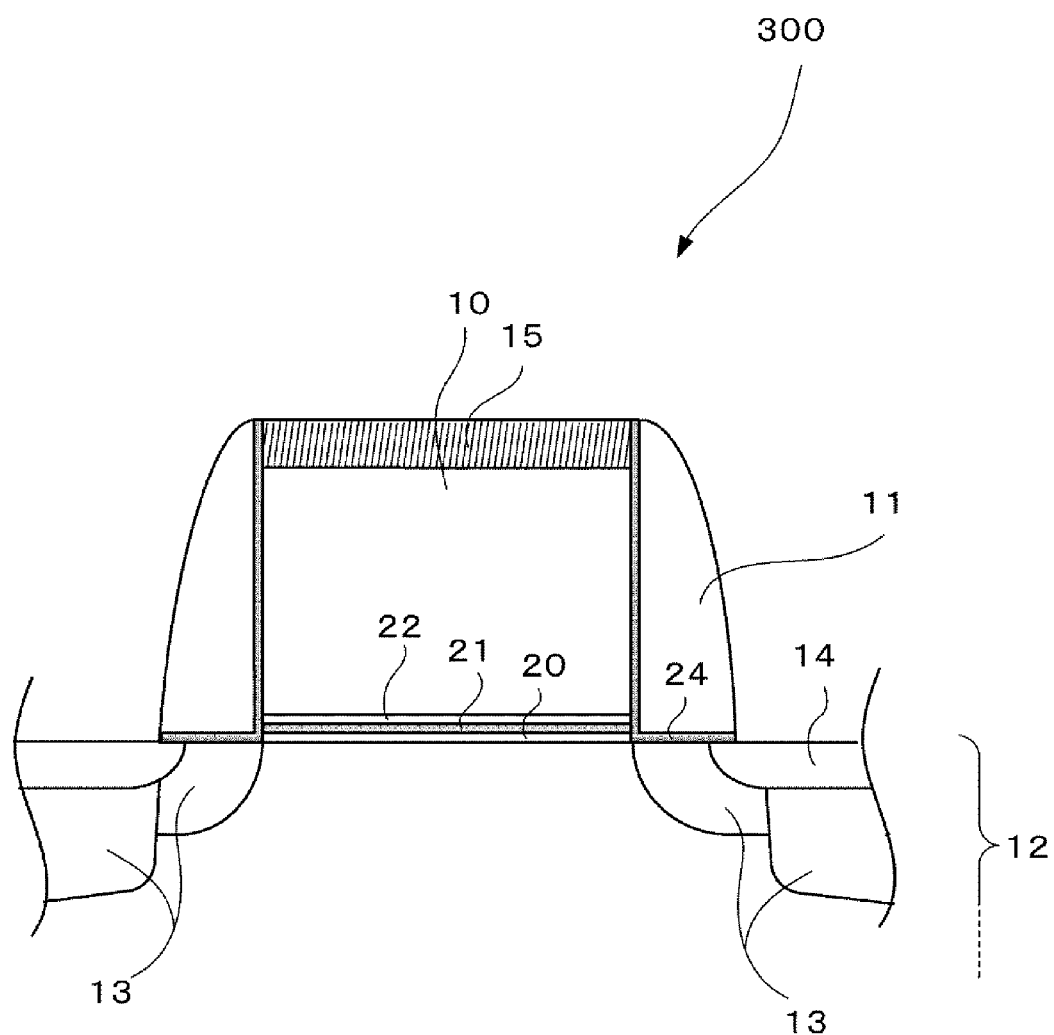
FIG. 3 is a schematic sectional view of a non-volatile semiconductor memory in a third embodiment.

FIG. 3 shows a sectional view of a non-volatile semiconductor memory 300 to which the present invention is applied. The non-volatile semiconductor memory 300 has the second silicon nitride film 24 that is in contact with the silicon substrate 12 and the first electrode 10. The side wall 11 is formed to cover the second silicon nitride film 24. Like the aforementioned second silicon nitride film 23, the second silicon nitride film 24 preferably has a thickness of at least 45 Å.

Charges captured in the first silicon nitride film 21 are allowed to diffuse into the first electrode 10 and the silicon substrate 12 via the second silicon nitride film 24, leading to higher efficiency than in the case of diffusing only into the silicon substrate 12. This can enhance the degree of freedom in setting the temperature and time of heat treatment.

Fourth Embodiment

Figure 4:
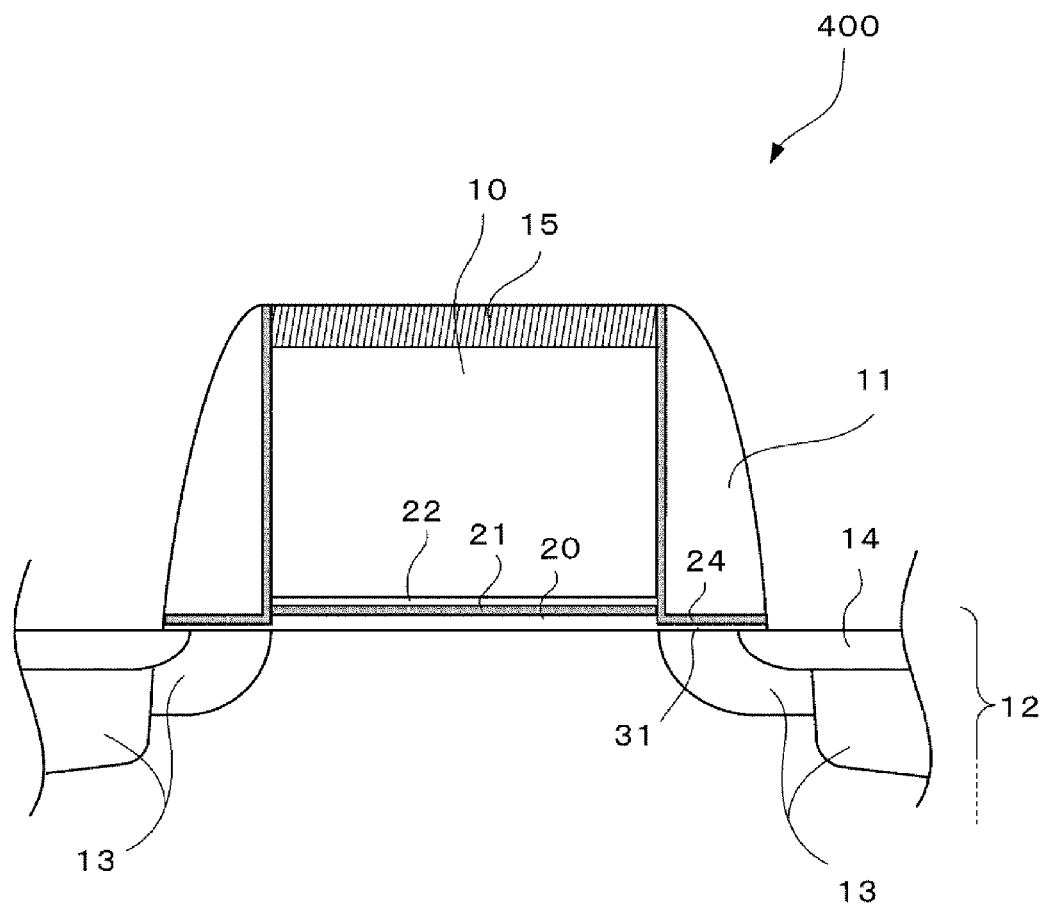
FIG. 4 is a schematic sectional view of a non-volatile semiconductor memory in a fourth embodiment.

FIG. 4 shows a sectional view of a non-volatile semiconductor memory 400 to which the present invention is applied. The non-volatile semiconductor memory 400 is formed by adding a third silicon oxide film 31 to the components of the non-volatile semiconductor memory 300. The second silicon nitride film 24 is in contact with the silicon substrate 12 via the third silicon oxide film 31. The third silicon oxide film 31 is formed to have a thickness that is smaller than the thickness of the first silicon oxide film 20. This allows charges in the first silicon nitride film 21 to diffuse via the third silicon oxide film 31, even when the first silicon oxide film 20 serves as a barrier to the diffusion of the charges. Like the aforementioned third silicon oxide film 30, the third silicon oxide film 31 preferably has a thickness of not more than 22 Å.

The third silicon oxide film 31 may be intentionally formed, or may be naturally formed in a step before the second silicon nitride film 24 is formed.

In each of the aforementioned non-volatile semiconductor memories 100, 200, 300, and 400, the silicide region 14 is formed in the silicon substrate 12. The silicide region 14 has a lower electrical resistance as compared to other parts of the silicon substrate 12. Therefore, it is preferable to provide the silicide region 14, which leads to an enhancement of efficiency in performing the step of diffusing charges of the process charge into the substrate.

Fifth Embodiment

Figure 7:
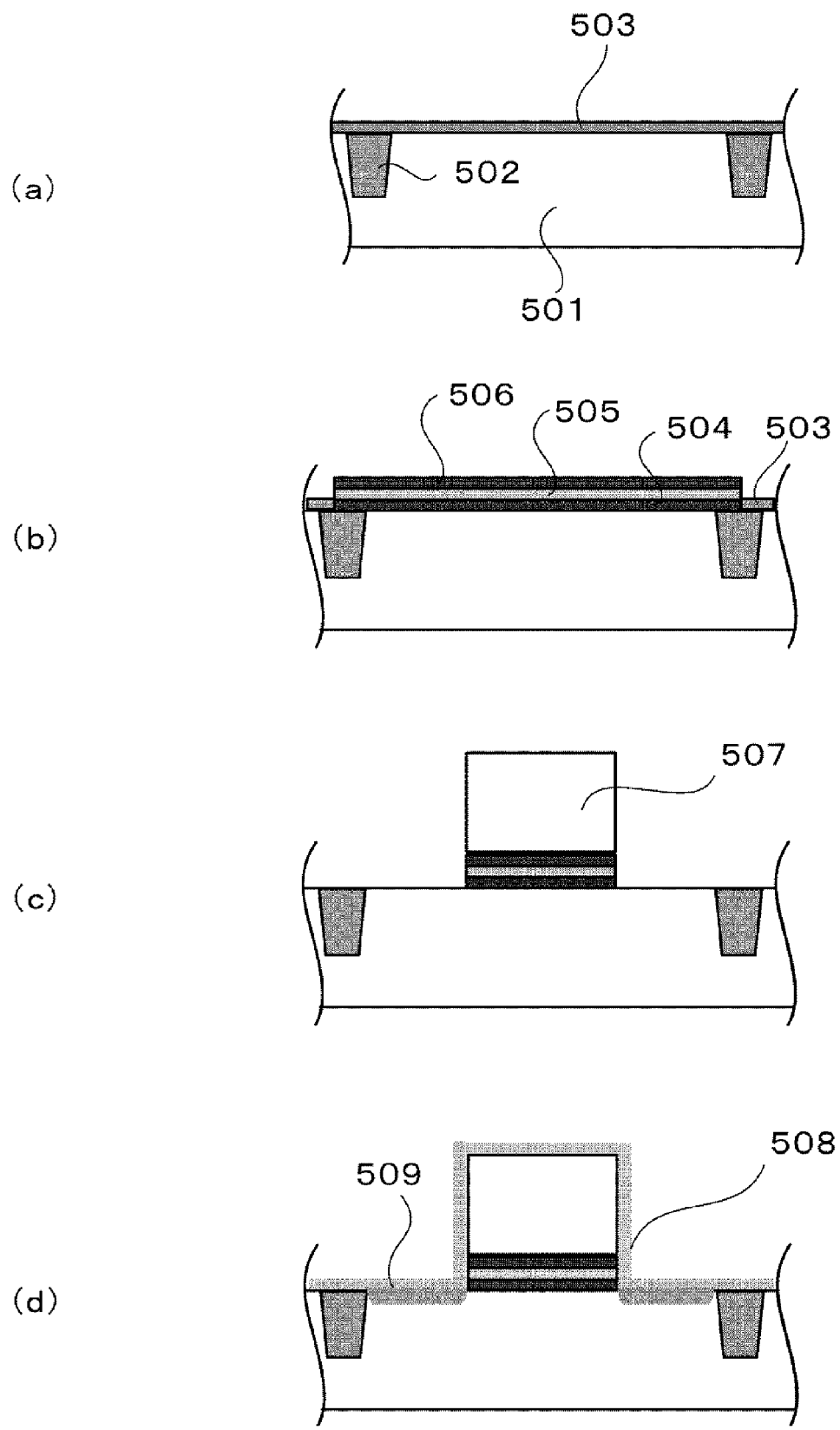
FIG. 7 is a pattern diagram showing part of production process.
Figure 8:
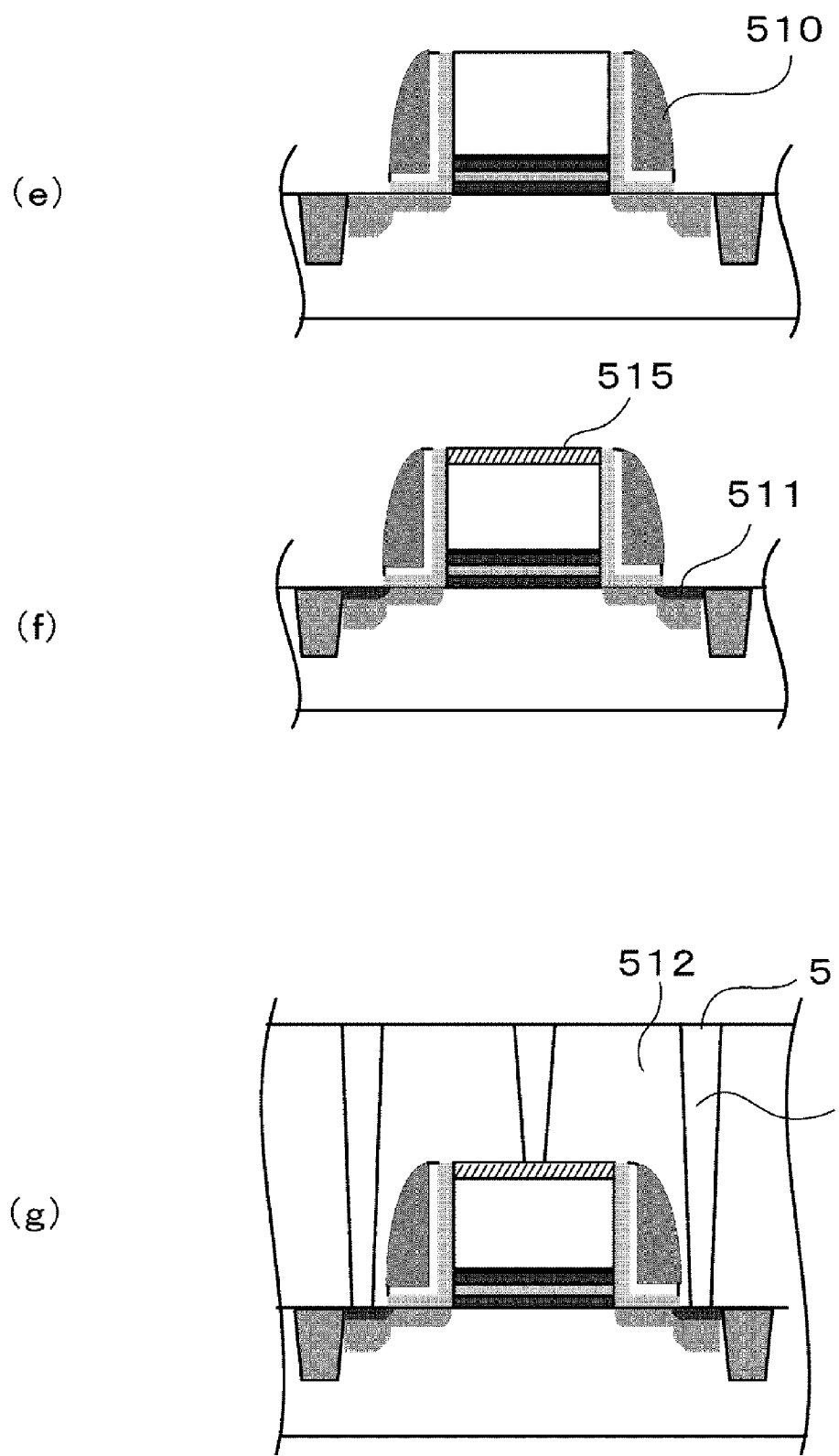
FIG. 8 is a pattern diagram showing part of production process.

This embodiment describes an example of a method for producing a non-volatile semiconductor memory with an ONO structure according to the present invention. Specifically, a method for producing the aforementioned non-volatile semiconductor memory 300 or 400 is described. FIG. 7 and FIG. 8 show pattern diagrams of sectional views of devices in production processes. It should be noted that only parts of the non-volatile semiconductor memory are illustrated herein, and other types of devices are also formed simultaneously. Further, the region that forms the non-volatile semiconductor memory is referred to as ONO region.

FIG. 7(a) shows a state where, after a STI (Shallow Trench Isolation) 502 is formed on a silicon substrate 501, a dummy oxide film 503 is formed thereon. The dummy oxide film 503 serves to eliminate the influence on the substrate, which is caused when an ONO structure is removed from regions other than the ONO region in formation of the ONO structure. Thereafter, the dummy oxide film 503 in the ONO region is removed, so that the ONO structure is layered. FIG. 7(b) shows a state where, after the ONO structure is layered, the ONO structure formed on the dummy oxide film 503 is removed. Thereafter, the remaining dummy oxide film 503 is removed, and a gate oxide film of a transistor is formed in regions other than the ONO region. The ONO structure in the ONO region is composed of the first silicon oxide film 504, the first silicon nitride film 505, and the second silicon oxide film 506.

Next, a polysilicon film is deposited on the entire surface, and a first gate electrode 507 of a predetermined shape is formed by dry etching (FIG. 7(c)). The step of dry etching is a step of causing the process charge (hereinafter, referred to as charge accumulation step). Subsequently, ions are implanted corresponding to devices, so that an impurity region 509 is formed. Thereafter, a second silicon nitride film 508 is deposited (FIG. 7(d)).

Next, a silicon oxide film is deposited to form a side wall, and a side wall 510 is formed by anisotropic etching. Such anisotropic etching is also included in the charge accumulation step. Since silicon nitride films have a high stress, defects may sometimes occur due to the stress when the side wall is composed only of such a silicon nitride film. Accordingly, it is preferable that the side wall 510 has a layer structure with a silicon oxide film, not being composed only of the silicon nitride film. Subsequently, ions for forming a source region/drain region are implanted, followed by activation annealing (FIG. 8(e)). The activation annealing serves as a step of diffusing charges of the process charge (hereinafter, referred to as charge diffusion step). Charges accumulated in the first silicon nitride film 505 and the second silicon nitride film 508 diffuse into the silicon substrate 501 and the first gate electrode 507 by the activation annealing.

Next, a cobalt silicide region 511 and a cobalt silicide layer 515 are formed by sputtering Co (cobalt) followed by annealing. In this step, the sputtering serves as a charge accumulation step, and the annealing serves as a charge diffusion step (FIG. 8(f)).

Next, an interlayer insulating film 512 is formed, and a contact hole 513 is formed by dry etching. The dry etching serves as a charge accumulation step, and a subsequent step of forming an interconnect 514 by depositing tungsten or the like, followed by annealing serves as a charge diffusion step (FIG. 8(g)).

Subsequently, a charge accumulation step and a charge diffusion step are repeated by performing sputtering, etching, and annealing in a predetermined manner, in order to form a necessary number of layers of interlayer insulating films, contact holes, and interconnects. The charges accumulated in the ONO structure (trap layer) composed of the first silicon oxide film 504, the first silicon nitride film 505, and the second silicon oxide film 506 in a charge accumulation step are allowed to diffuse into the silicon substrate 501 and the first gate electrode 507 in a charge diffusion step. In order to prevent the charges from being captured in the trap layer at the end of all the necessary steps for production, it is preferable to perform a charge diffusion step after the final charge accumulation step. It is further preferable that the final step is a charge diffusion step. This makes it possible to produce a non-volatile semiconductor memory free from adverse effects due to the process charge.

Further, the aforementioned production process may additionally include a step of forming a third silicon oxide film before the second silicon nitride film 508 is formed. For example, the third silicon oxide film may be intentionally formed as follows: when the first gate electrode 507 of a predetermined shape is formed by dry etching, the silicon oxide film is processed to be left so that the silicon substrate is not exposed. Alternatively, the production process may be configured in consideration of use of a silicon oxide film that is naturally formed between the silicon substrate and the second silicon nitride film in the production process as the third silicon oxide film.

Although this embodiment describes a method for producing the non-volatile semiconductor memory 300 or 400, a different production process is taken in the case of producing the non-volatile semiconductor memory 100 or 200 because the shape of the second silicon nitride film is different. However, the same advantageous effects as those in the production method described in this embodiment can be obtained by providing a charge diffusion step after a charge accumulation step.

Hereinbefore, application examples and embodiments according to the present invention are described. However, the present invention is not limited to the aforementioned descriptions. The present invention can be widely applied without departing from the scope of the invention.

REFERENCE SIGNS LIST

10: First Electrode
11: Side Wall
12: Silicon Substrate
13: Source/Drain Region
14: Silicide Region
15: Silicide Layer
20: First Silicon Oxide Film
21: First Silicon Nitride Film
22: Second Silicon Oxide Film
23: Second Silicon Nitride Film
24: Second Silicon Nitride Film
30: Third Silicon Oxide Film
31: Third Silicon Oxide Film
100: Non-Volatile Semiconductor Memory
200: Non-Volatile Semiconductor Memory
300: Non-Volatile Semiconductor Memory
400: Non-Volatile Semiconductor Memory
501: Silicon Substrate
502: STI
503: Dummy Oxide Film
504: First Silicon Oxide Film
505: First Silicon Nitride Film
506: Second Silicon Oxide Film
507: First Gate Electrode
508: Second Silicon Nitride Film
509: Impurity Region
510: Side Wall
511: Cobalt Silicide Region
512: Interlayer Insulating Film
513: Contact Hole
514: Interconnect
515: Cobalt Silicide Layer
900: Non-Volatile Semiconductor Memory The entire disclosure of Japanese Patent Application No. 2012-041221,filed Feb. 28, 2012 is expressly incorporated by reference herein.

The invention claimed is:
1. A non-volatile semiconductor memory comprising:
a silicon substrate;
a first silicon oxide film;
a second silicon oxide film;
a third silicon oxide film;

a first silicon nitride film;
a second silicon nitride film; and
a fourth silicon oxide film, wherein
the first silicon oxide film and the third silicon oxide film are layered on the silicon substrate,
the first silicon nitride film is layered on the first silicon oxide film,
the second silicon oxide film is layered on the first silicon nitride film,
the third silicon oxide film has a thickness that is smaller than that of the first silicon oxide film,
the second silicon nitride film has a first part that is in contact with the first silicon nitride film, the first silicon oxide film and the second silicon oxide film, and a second part that is in contact with and layered on the third silicon oxide film, and
the fourth silicon oxide film has a layer structure with the fourth silicon oxide film layered on the second silicon nitride film, which together define a side wall, such that the second silicon nitride film is layered between the fourth silicon oxide film and the third silicon oxide film along a lower surface of the fourth silicon oxide film.

2. The non-volatile semiconductor memory according to claim 1, further comprising:
a silicide region in the silicon substrate, wherein
the silicide region is in contact with the third silicon oxide film.

3. The non-volatile semiconductor memory according to claim 1, further comprising:
a first electrode on the second silicon oxide film, wherein
the second silicon nitride film has a third part that is in contact with the first electrode.

4. The non-volatile semiconductor memory according to claim 1, wherein
the third silicon oxide film has a thickness of not more than 22 Å.

5. The non-volatile semiconductor memory according to claim 1, wherein
the second silicon nitride film has a thickness of at least 45 Å.

6. A method for producing a non-volatile semiconductor memory, comprising:
a first step of forming a first silicon oxide film on a silicon substrate;
a second step of forming a first silicon nitride film on the first silicon oxide film;
a third step of forming a second silicon oxide film on the first silicon nitride film;
a fourth step of patterning the first silicon oxide film, the first silicon nitride film, and the second silicon oxide film into predetermined shapes;
a fifth step of forming a second silicon nitride film after the fourth step; and
a seventh step of forming a fourth silicon oxide, wherein
in the fourth step, the first silicon nitride film and the silicon substrate are exposed,
in a sixth step, between the fourth step and the fifth step, in a region where the silicon substrate is exposed, a third silicon oxide film is formed, which has a thickness that is smaller than a thickness of the first silicon oxide film,
in the fifth step, the first silicon nitride film and the second silicon nitride film are in contact with each other, and
in the seventh step, the fourth silicon oxide film is layered on the second silicon nitride film to form a side wall with a layer structure, such that the second silicon nitride film is layered between the fourth silicon oxide film and the third silicon oxide film along a lower surface of the fourth silicon oxide film.

7. A method for producing a non-volatile semiconductor memory, comprising:
a first step of forming a first silicon oxide film on a silicon substrate;
a second step of forming a first silicon nitride film on the first silicon oxide film;
a third step of forming a second silicon oxide film on the first silicon nitride film;
a fourth step of patterning the first silicon oxide film, the first silicon nitride film, and the second silicon oxide film into predetermined shapes;
a fifth step of forming a second silicon nitride film after the fourth step; and
a sixth step of forming a fourth silicon oxide film, wherein
in the fourth step, the first silicon nitride film is exposed, and the first silicon oxide film is etched, so that a third silicon oxide film having a thickness that is smaller than that of the first silicon oxide film is formed,
in the fifth step, the first silicon nitride film and the second silicon nitride film are in contact with each other, and
in the sixth step, the fourth silicon oxide film is layered on the second silicon nitride film to form a side wall with a layer structure, such that the second silicon nitride film is layered between the fourth silicon oxide film and the third silicon oxide film along a lower surface of the fourth silicon oxide film.

* * * * *